United States Patent [19]

Eckersley

[11] Patent Number: 5,191,520
[45] Date of Patent: Mar. 2, 1993

[54] POWER SUPPLY SYSTEM

[75] Inventor: Gregory P. Eckersley, Melbourne, Australia

[73] Assignee: Boral Johns Perry Industries Pty. Ltd., Cheltenham, Australia

[21] Appl. No.: 730,898

[22] PCT Filed: Feb. 6, 1990

[86] PCT No.: PCT/AU90/00041

§ 371 Date: Sep. 18, 1991

§ 102(e) Date: Sep. 18, 1991

[87] PCT Pub. No.: WO90/09050

PCT Pub. Date: Aug. 9, 1990

[30] Foreign Application Priority Data

Feb. 6, 1989 [AU] Australia ............... PJ2582
Apr. 18, 1989 [AU] Australia ............... PJ3751

[51] Int. Cl.⁵ ............................................. H02J 13/00
[52] U.S. Cl. ......................................... 363/72; 307/35; 307/38; 307/40
[58] Field of Search ................. 363/71, 72; 307/35, 307/38, 40

[56] References Cited

U.S. PATENT DOCUMENTS 3,769,520 10/1973 Carrington .
4,090,088 5/1978 McMahon et al. .
4,125,782 11/1978 Pollnow, Jr. .
4,211,933 7/1980 Hedges et al. .
4,324,987 4/1982 Sullivan, II et al. .
4,336,462 6/1982 Hedges et al. .
4,471,232 9/1984 Peddie et al. .
4,489,386 12/1984 Breddan ................. 307/35 X Primary Examiner—Emanuel T. Voeltz

[57] ABSTRACT

A power supply system (10) comprises a multi-phase AC supply (12) which is provided to an AC-DC convertor (14). The DC output from the convertor (14) sources power to a DC bus (16), which then provides power to a secondary supply bus (42) and electrical loads (38, 40). The convertor (14) is connected to the DC bus (16) by a master controller (22), which is controllable by master control processor (30) to disconnect the two. In a similar way, the secondary supply bus (44), load (38) and load (40) are connected to the DC bus (16) by slave controllers (46), which are each controllable to effect disconnection through action of the respective slave control processors (48). When any of the secondary supply bus (44) or loads (38, 40) demand power from convertor (14), a demand request is passed by the respective slave control processor (48) to the master control processor (30) via data bus (32). The master control processor (30) then determines whether the demand request is legal based on a maximum permissible power request and will also consider the instant cummulative sum of power required to be provided. If the request is legal, a demand authorization is returned to the slave control processor (48), and the power can be drawn. If the request is not legal, the master control processor (30) can require one or all slave control processors (48) to power down the electrical load through operation of contactors (24) in the respective slave controllers (46). Alternatively, the slave control processor (48) making the demand request can be caused to effect the regeneration of power. In the instance of serious faults, the master control processor (30) can cause the DC bus (16) to be powered down by effecting operation of contactors (24) within the master controller (22).

10 Claims, 3 Drawing Sheets

POWER SUPPLY SYSTEM

FIELD OF THE INVENTION

This invention relates to a power supply system for use in conjunction with one or more electrical loads, and has particular but not exclusive application in the control of lift machines.

DESCRIPTION OF THE PRIOR ART

A discussion of the prior art and the description of preferred embodiments will be made with reference to the application of lifts. It should be understood that the invention is equally applicable to other applications having electrical loads.

In modern lift installations, it is common to use DC machines as the prime-mover for lift cars and their associated counterweights; these machines being connected to the ropes suspending the lift cars and counterweights via a gearbox, or alternatively through direct connection to the sheave wheel. Since lift cars must travel in both the upward and downward directions, DC machines are required to be controllable directionwise and have precise speed control.

Pulse width modulated (PWM) converters are often used in conjunction with DC machines to provide either two or four quadrant control over the machine. A four quadrant control allows for the regeneration of power into the supply network during deceleration of the lift car. PWM (converters) usually operate from a multi-phase AC supply, which supply is then rectified and controlled to give the appropriate output voltage and polarity to achieve the desired speed and direction of rotation of the DC machine.

It is also known to utilize slow speed AC machines in lift applications, which must again be speed controllable. For this purpose, AC-AC converters are most often used whereby the multi-phase supply is rectified to a DC bus, then inverted to provide the required output frequency in voltage, in turn to cause the AC machine to operate the desired speed with the requisite torque. Optionally, cycloconverters can provide direct frequency conversion synthesizing lower frequency outputs from the mains supply.

It is particularly desirable that lift drives be of low cost, have low radiated acoustic noise and radio frequency interference, and can provide at least partial service under all supply conditions. The discussed known systems have the drawback of being particularly costly and complex.

Further, in the case of a DC machine, when a fault occurs on the machine itself there may be arcing between the rotor brushes. These arcs are inherently difficult to extinguish, given that there are no zero crossings in voltage to allow natural commutation as is the case for AC machines.

Circuit breakers are not cost effective in protecting DC drives from localised faults such as output short circuits, and can often cause significant damage to both the motor and the converter.

Whilst DC machines have the problems discussed, they have often been preferred over AC machines, given that they have superior speed regulation and torque characteristics.

As for AC machines, constant field (synchronous) machines offer advantages over the cheaper induction (non-synchronous) motors. They can provide inherent braking capability on power loss where a stator load is provided and especially if permanent magnetic fields are used, the air gap is large enough to allow reasonably lightweight design providing for deflection as a result of lateral rotor loads, and afford greater efficiency at low speed or stall conditions.

The present invention has an object the provision of a power supply system which will overcome the problems referred to above.

SUMMARY OF THE INVENTION

Therefore the invention in one aspect, provides a power supply system comprising:

a controllable converter suitable for connection to an input supply and being adapted to generate an output supply;

a plurality of loads each making a demand for power from the converter;

a plurality of load controllers each interposed between the and a load; and a supply controller which can communicate with all of said load controllers and control the generation of the output supply, said supply controller receiving requests from each controller in response to a demand by a respective load, authorizing the load demand as a limit of power to be drawn by that load and if the actual power drawn by that load is greater than the said limit, momentarily disconnecting the output supply to all loads.

The invention, in yet another aspect, provides a method of controlling a power supply system having a controllable converter connected to an input supply and providing an output supply, a plurality of loads connected to the output supply by respective load controllers, and a supply controller in communication with the load controllers and having control over the generation of the output supply, the method comprising the steps of:

(a) requesting of the supply controller a demand for power from a one of said loads by its respective load controller;

(b) authorizing by the supply controller the demand as limit of power to be drawn by that load;

(c) determining by the supply controller whether the actual power drawn by the requesting load is greater than the limit for that load; and if so, (d) momentarily disconnecting the output supply to all loads.

BRIEF DESCRIPTION OF THE DRAWINGS

In order that the invention may be more easily understood a preferred embodiment will now be described with reference to the examples shown in the accompanying drawings wherein.

DETAILED DESCRIPTION OF PREFERRED EMBODIMENTS

Although the present embodiment will be described with reference to an AC to DC conversion in a power supply system, it will be appreciated the invention is equally applicable to AC-AC conversion.

Figure 1:
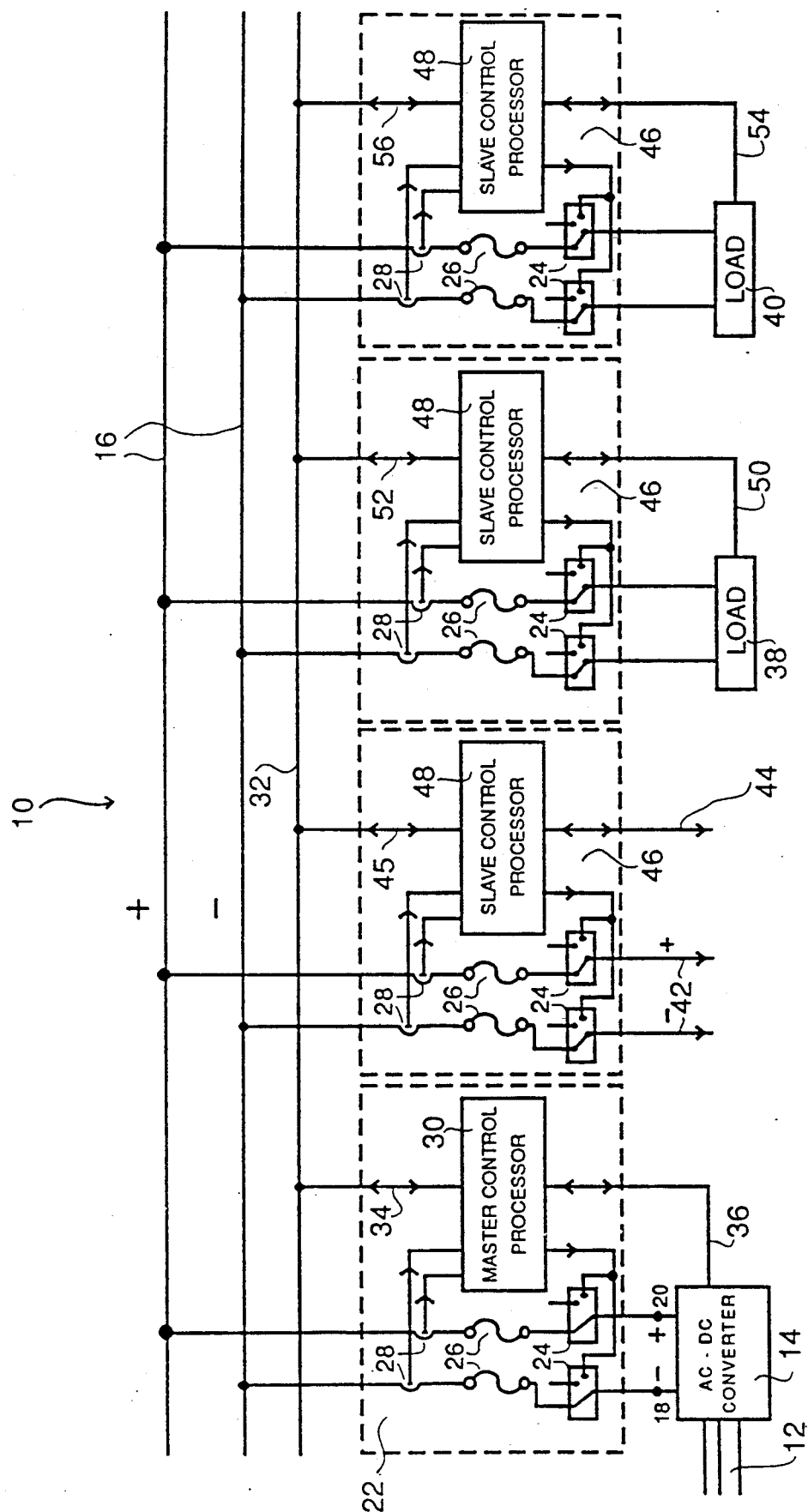
FIG. 1 shows a typical overall configuration of the embodiment.

FIG. 1 shows a multi-load system 10 as could be implemented in a building having a number of lifts forming electrical loads. Some of the lifts may be installed in the one motor room whilst others may be located in a separate motor room at another level in the building. The capability of a distributed lifting system having a single point of supply and control is a particular advantage of the embodiment.

The three phase AC supply 12 providing power to the whole of the system 10 is shown input to the AC-DC converter 14. The converter 14 rectifies the mains supply 12 to provide a DC voltage, which forms the driving point for DC bus 16, comprising positive and negative rails as shown.

The converter 14 is responsible for the generation of all power for loads attached to the system 10. The DC output from the converter 14 is shown at terminals 18 and 20, including the relative polarity. Terminals 18 and 20 are connected to the DC bus 16 through the controlling switchgear of master controller 22. This switchgear comprises a control contactor 24 in each of the power lines together with fuse elements 26 and current sensing devices 28. Both the contactors 24 and current sensing devices 28 are under the control of master control processor 30.

The master control processor 30 also provides and receives data signals to and from the data bus 32 via line 34, as well as sending or receiving data signals from the converter 14 along line 36.

The function of the data signals common to the data bus 32 and the other elements in the system 10 will be described presently.

In the present embodiment, the system 10 further comprises two loads 38 and 40, which are lift drives, together with a secondary supply bus 42 and accompanying data link 44 which are reticulated to other locations within the building. The secondary supply bus 42 is suitable for connection to a number of other loads in a remote location or locations within the building.

The use of a single constant voltage DC supply bus 16 for a given group of loads 38 and 40, together with the secondary supply bus 42 has the advantage of reducing the total number of rectifier links, while load averaging also reduces the amount of energy returned to the AC supply 12 during regeneration by any of the loads. The overall system power loss as a result of inverter inefficiency within the loads is also reduced.

By the provision of a single DC bus 16 and secondary supply bus 42 to supply power to all loads throughout the building, a substantial reduction in the amount of bus bar material as against a three phase reticulation system having the same peak line to line voltage would also be achieved.

The secondary supply bus 42 is connected to the DC bus 16 by a similar controller as that for the converter 14, designated as slave controller 46. In the same way, the connection to data link 44 is via the slave controller 46, in turn being connected to data bus 32 by line 45.

The system 10 shows two loads 38 and 40, each drawing power from DC bus 16 to which they are connected via respective slave controllers 46.

Elements of the three slave controllers 46 in common with master controller 22 are shown as like-numbered items. In contrast, the slave control processors 48 are uniquely identified, since they serve a slightly different function to master control processor 30.

Load 38 communicates data with slave control processor 48 on line 50, the processor 48 in turn communicating data with data bus 32 on line 52. The same situation occurs for load 40 with respective lines 54 and 56.

Figure 2:
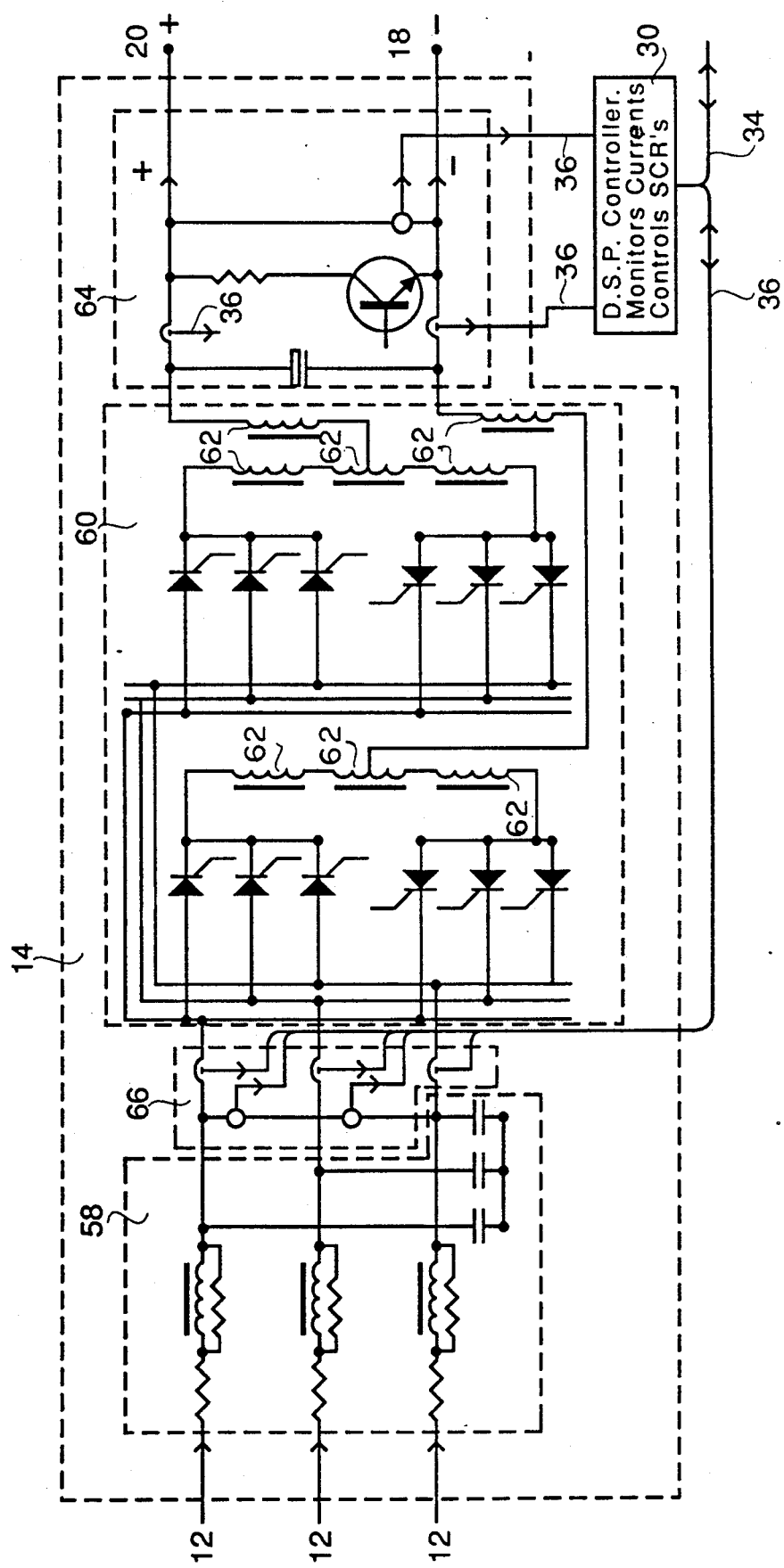
FIG. 2 shows the rectifier/inverter of FIG. 1 in more detail.

FIG. 2 shows the AC-DC converter 14 of FIG. 1 in more detail. Items common with FIG. 1 are shown like-numbered.

The three phase AC supply 12 is supplied from a phase splitting transformer (not shown) and is then rectified by the converter 14 to produce the DC supply for DC bus 16. Connection to the DC bus 16 is via terminals 18 and 20.

The supply 12 is firstly provided to an input filter section 58 which comprises inductance, resistance and capacitance elements, including the resistance and inductance of the AC supply 12 itself. Once the AC supply 12 has been filtered, it is then provided to rectifier section 60. The rectifier section 60 comprises dual six-pulse rectifiers. The dual system allows the rectifier section 60 to continue to function on a reduced power basis as a six-pulse system on failure of either bridge.

The output from each half bridge forms one rail of the DC output. The output of each half bridge is smoothed by mutually coupled inductors 62. A protection section 64 is also provided for protection of the DC output.

FIG. 2 also shows the master control processor 30 together with its interconnection to converter 14 through line 36, and to data bus 32 through line 34. The master control processor 30 receives signals from current sensing devices in the protection section 64, and also from input current and voltage sensing section 66. All these signals are utilised in the control and protection logic appropriate for the converter 14 as well as the overall system 10.

Figure 3:
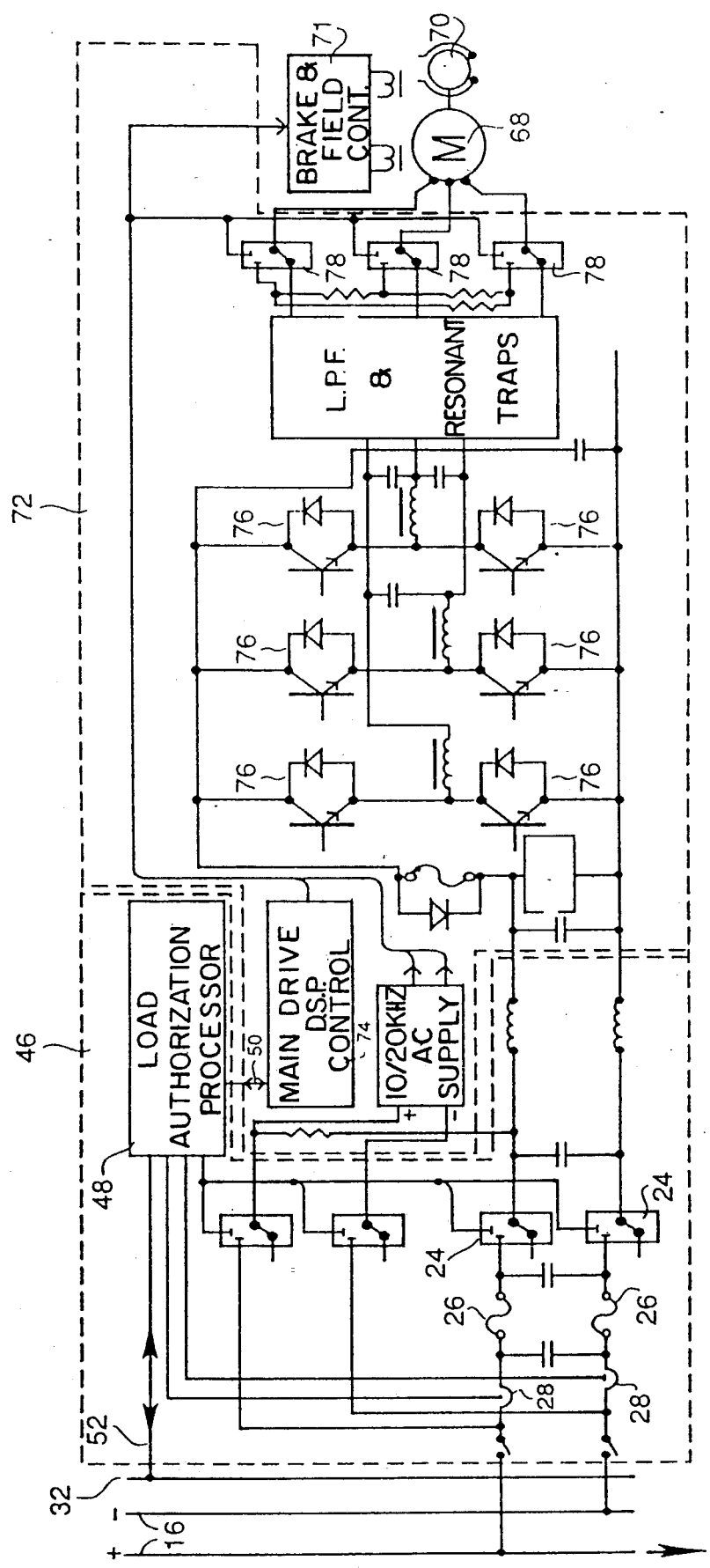
FIG. 3 shows greater detail of one of the loads in FIG. 1.

Referring now to FIG. 3, there is shown an example of a load within the system 10, which could be either load 38 or load 40.

Again, common elements with FIGS. 1 and 2 are shown as been like-numbered.

Taking load 38 in this instance, which comprises an AC motor 68, an accompanying brake mechanism 70, field controller 71, and drive inverter 72.

Slave control processor 46 is shown interposed between the DC bus 16 and the drive inverter 72.

The contactors 24, fuse elements 26 and current sensing devices 28 are shown within the slave controller 46 in accordance with the example of FIG. 1.

The drive inverter 72 comprises a six pulse bipolar junction transistor (BJT) bridge, which is under control of the digital signal processing (DSP) control element 74. The DSP control element 74 provides the necessary drive signals to the bases of the BJT's 76, and to the output contactors 78.

The DSP control element 74 is under instruction from the slave control processor 48 via line 50, the slave control processor 48 in turn being under control of the master control processor 30 via the data bus 32 and line 52.

The slave control processor 48 monitors the condition of the motor 68, the brake 70, the field controller 71, the drive inverter 72, and provides controlling instructions to the DSP control element 74 in order to operate the lift which has the motor 68 as the prime mover of the attached lift car and counterweight.

We will now consider the detailed inter-relation between the master control processor 30 and each slave control processor 48.

In normal operation, each slave control processor 48 must continuously request authorisation from the master control processor 40 for any demanded power. Therefore, some form of load prediction is required to allow the load demand estimation to be made and considered before the load is actually drawn. A load demand will usually be in respect of current and must be authorised to the respective load authorisation processor 48 before the load can be drawn. Each load will have a (adjustable) upper bound on any allocated limit, which can not be exceeded by any one load demand.

The interaction between the master control processor 30 and slave control processors 48 can best be described as a request and authorisation procedure.

The special functioning provided by the embodiment is the detection of faults on any load connected to the DC bus 16. If a load makes a normal load demand which is authorised, but subsequently draws an actual load greater than that authorised limit (detected, say, by current transformers 28), the master control processor 30 assumes there is a fault on that load, and momentarily disconnects all the loads from the DC bus 16 by operation of the contactor 24 in the master controller 22. This is an attempt to extinguish any arc which may be occuring, which is difficult for DC applications due to there being no natural zero voltage crossings. It would also be possible to effect virtual disconnection through phase control of the AC-DC converter 14 to force the DC bus voltage to zero.

Once reconnection occurs, if the load demand is persisting above the allocated limit, a further momentary disconnection by contactors 24 could take place. If the load demand persists above the allocated limit after a number of further momentary disconnections, it is assumed there is a continuing fault on that load, and the master control processor 30 causes the respective slave control processor 48 to disconnect that load.

If, after the first momentary disconnection, the load demand is at or below the allocated limit for that load, normal operation is restored. Any momentary disconnection would be brief enough so that operation of the various loads would not be noticably affected, including lift cars in motion. Some form of momentary energy storage is preferable for the DC bus 16.

In another situation where supply is limited, and a particular load makes a load demand which would take the total load demand from all the loads to be greater than an (adjustable) maximum governed by the limited supply, the master control processor 30 will not authorise the request to allow the particular slave control processor 48 to draw that demand, rather, the load must wait until the converter 14 can provide the power at some later time, i.e., not until the total load demand drops below the maximum. The result is that a lift car may be caused to pause at a floor until a demand request can be authorized.

It is also possible to authorize the request a period of time following the total load falling below the maximum. This is to be differentiated from the former case where a load making a persisting load demand above its allocated limit is assumed to be experiencing a fault, in which case it will be disconnected and not restored until examined by a technician.

The upper bound on the limit for each load 38, 40 is adjustable as indicated, and this is achieved by suitable programming of the master controller processor 30. In the same way, the maximum total load demand can be programmed, and be adjusted to satisfy the particular supply 12 that is available and any additional loads. This flexibility is advantageous in that it becomes less critical to size contactors and fuse links to cope with all type of fault conditions, since the next-level-up protection can provide for the early detection and suppression of faults.

In considering the implementation of the data bus configuration in relation to the master and slave controllers, it is possible to choose any suitably known system. As an example, the specifications contained for within IEEE Standard 802.4 could easily be utilised. The foregoing description has specified a master control processor 30 and a number of slave control processors 48. It is not necessary that such a configuration be used, rather, it would be equally applicable to have a token ring passing network in place in which case the control processor holding the token at a particular time effectively would be the master and authorize load demands.

I claim:

1. A power supply system comprising:
   a controllable converter suitable for connection to an input supply and being adapted to generate an output supply;
   a plurality of loads each making a demand for power from the converter;
   a plurality of load controllers each interposed between the said output supply and a load; and
   a supply controller which can communicate with all of said load controllers and control the generation of the output supply, said supply controller receiving requests from each load controller in response to a demand by a respective load, authorizing the demand as a limit of power to be drawn by that load, and if the actual power drawn by that load as sensed by the respective load controller is greater than the said limit momentarily disconnecting the output supply to all the loads.

2. A power supply system as claimed in claim 1, wherein the supply controller will momentarily disconnect the output supply a number of times in response to the actual power drawn by a load persisting to be greater than the said limit, whereafter, if the limit is still exceeded the responsible load controller is instructed by the supply controller to disconnect its load.

3. A power supply system as claimed in claim 1, wherein the said limit for each load has an upper bound and the supply controller will not authorize a demand being in excess of the said upper bound.

4. The power supply system as claimed in claim 1, wherein
   said supply controller further determines whether authorizing that request would result in the total demand from all the loads being greater than a maximum, and if so, not authorizing the request, otherwise authorizing the request.

5. A system as claimed in claim 4, wherein a request which was not authorized can be reconsidered some time later, and if the total demand has fallen below the maximum then authorizing the request.

6. A method of controlling a power supply system having a controllable converter connected to an input supply and providing an output supply, a plurality of loads connected to the output supply by respective load controllers, and a supply controller in communication with the load controllers and having control of the generation of the output supply, the method comprising the steps of:

(a) requesting of the supply controller a demand for power from a one of said loads by its respective load controller;
(b) authorizing by the supply controller the demand as a limit of power to be drawn by that load;
(c) determining by the supply controller whether the actual power drawn by the requesting load is greater than the limit for that load; and if so,
(d) causing momentary disconnection by the supply controller of the output supply to all loads.

7. A method as claimed in claim 6, wherein step (d) is repeated a number of times in response to the actual power drawn by a load persisting to be greater than the said limit, after which time if the said limit is still exceeded the responsible load controller is instructed by the supply controller to disconnect its load.

8. A method as claimed in claim 6, wherein the said limit authorized by the supply controller to each request made by a load controller has an upper bound for each load and the supply controller will not authorize a demand being in excess of the said upper bound.

9. The method as claimed in claim 6 further comprising the steps of:
(e) determining by the supply controller whether authorizing a demand would result in the total demand from all the loads being greater than a maximum, and if so,
(f) not authorizing the request, otherwise
(g) authorizing the request, and
(h) reconsidering a request that was not authorized some time later, and if the total demand has fallen below the maximum authorizing the request.

10. A method as claimed in claim 9, comprising the further step of reconsidering a request that was not authorized some time later, and if the total demand has fallen below the maximum authorizing the request.

* * * * *